US009223421B2

(12) United States Patent
Takashima et al.

(10) Patent No.: US 9,223,421 B2
(45) Date of Patent: Dec. 29, 2015

(54) INPUT DEVICE AND ELECTRONIC APPARATUS USING THE SAME

(75) Inventors: Kouichiro Takashima, Tokyo (JP); Shun Kayama, Saitama (JP); Minoru Tomita, Saitama (JP); Yukiko Shimizu, Saitama (JP)

(73) Assignee: Sony Corporation, Tokyo (JP)

( * ) Notice: Subject to any disclaimer, the term of this patent is extended or adjusted under 35 U.S.C. 154(b) by 1491 days.

(21) Appl. No.: 12/396,245

(22) Filed: Mar. 2, 2009

(65) Prior Publication Data

US 2009/0219175 A1 Sep. 3, 2009

(30) Foreign Application Priority Data

Mar. 3, 2008 (JP) ................. 2008-052508

(51) Int. Cl.
*G06F 3/038* (2013.01)
*G06F 3/0354* (2013.01)
*H03K 17/94* (2006.01)
*H03K 17/96* (2006.01)

(52) U.S. Cl.
CPC ............ *G06F 3/038* (2013.01); *G06F 3/03547* (2013.01); *H03K 17/94* (2013.01); *H03K 17/962* (2013.01); *H03K 2217/96062* (2013.01)

(58) Field of Classification Search
CPC ..................................................... H03K 17/94
USPC ...................................................... 341/20, 23
See application file for complete search history.

(56) References Cited

U.S. PATENT DOCUMENTS 4,852,443 A * 8/1989 Duncan et al. .................. 84/733
5,212,621 A * 5/1993 Panter ........................... 361/181
5,914,465 A * 6/1999 Allen et al. ................. 178/18.06
6,449,492 B1 * 9/2002 Kenagy et al. .............. 455/550.1
8,086,417 B2 * 12/2011 Seguine ........................ 702/105
2001/0044318 A1 * 11/2001 Mantyjarvi et al. .......... 455/550

(Continued)

FOREIGN PATENT DOCUMENTS

EP 1 707 716 10/2006
GB 2 080 536 2/1982

(Continued)

OTHER PUBLICATIONS

Japanese Office Action (JP2008-052508) dated Dec. 10, 2009.
European Patent Office, European Search Report issued in connection with European Patent Application Serial No. 09002958.8, dated Dec. 16, 2011. (3 pages).

*Primary Examiner* — Amine Benlagsir
(74) *Attorney, Agent, or Firm* — K&L Gates LLP

(57) ABSTRACT

An input device includes an input-sensing unit that contains a capacitive input sensor and a sensitivity-sensing unit that contains a capacitive sensitivity sensor. The input-sensing unit senses position information obtained by touch operation of an operation body to the capacitive input sensor. The sensitivity-sensing unit senses sensitivity information obtained by touch operation of the operation body to the capacitive sensitivity sensor. The input device includes a control unit determining whether or not the output level of the position information from the input-sensing unit is adjusted based on the sensitivity information sensed by the sensitivity-sensing unit and a sensitivity-adjusting unit that adjusts an output level of the position information from the input-sensing unit based on a result of the determination of the control unit. The control unit controls the sensitivity-adjusting unit to adjust the output level of the position information received from the input-sensing unit.

7 Claims, 12 Drawing Sheets

(56) References Cited

U.S. PATENT DOCUMENTS

| | | | |
|---|---|---|---|
| 2002/0017136 A1* | 2/2002 | Morimura et al. | 73/514.32 |
| 2005/0253815 A1 | 11/2005 | Blacklock et al. | |
| 2006/0055534 A1* | 3/2006 | Fergusson | 340/562 |
| 2006/0167644 A1* | 7/2006 | Muller | 702/88 |
| 2007/0186663 A1* | 8/2007 | Chang et al. | 73/774 |
| 2007/0296709 A1* | 12/2007 | GuangHai | 345/173 |
| 2008/0067793 A1* | 3/2008 | Clos et al. | 280/735 |
| 2008/0122798 A1* | 5/2008 | Koshiyama et al. | 345/173 |
| 2009/0140985 A1* | 6/2009 | Liu | 345/168 |

FOREIGN PATENT DOCUMENTS

| | | |
|---|---|---|
| JP | 2000-184241 | 6/2000 |
| JP | 2005-284416 | 10/2005 |
| JP | 2007-027034 | 2/2007 |
| JP | 2008-033701 | 2/2008 |

* cited by examiner

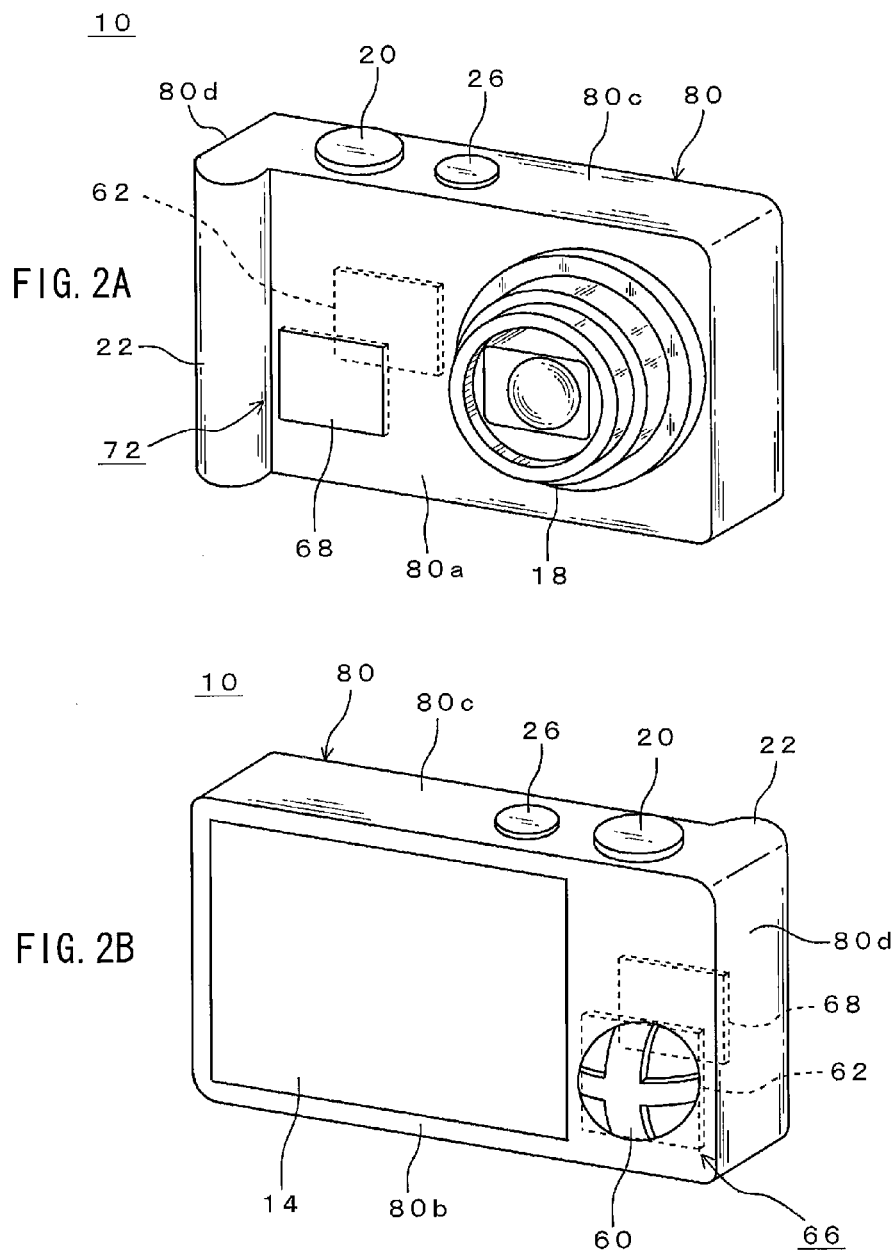

INPUT DEVICE AND ELECTRONIC APPARATUS USING THE SAME

CROSS REFERENCES TO RELATED APPLICATIONS

The present application claims priority to Japanese Patent Application JP2008-52508 filed in the Japanese Patent Office on Mar. 3, 2008, the entire contents of which being incorporated herein by reference.

BACKGROUND

The present application relates to an input device and an electronic apparatus using the same. It particularly relates to an input device which is applicable to an electronic apparatus such as a mobile phone and a camera.

Recently, a user has captured various kinds of contents to the mobile phone and a portable terminal such as personal digital assistants (PDA) and utilized them. The PDA and the like are respectively provided with input device such as a key board, a rotary operation member, i.e., jog dial, and a touch panel.

In the input device using the touch panel, the user performs a desired operation on the portable terminal and the like by inputting any position information with his or her finger or a stylus touching a display screen thereof. The touch panel includes a capacitive touch panel and a resistive touch panel. The capacitive touch panel has been widely accepted as the input device because it has been capable of being low-profiled and also has been designed flexibly to allow a variety in a shape of the panel itself.

For example, Japanese Patent Application Publication No. 2005-284416 has disclosed a digital camera which is provided with a capacitive touch panel (sensor) for slide-inputting on an upper plate of the camera main body. The user can perform an operation such as zoom-in, zoom-out, reproduction/forward/rewind, focus adjustment and volume adjustment by sliding his or her finger to a desired direction with the finger touching the capacitive input sheet.

Here, the following will describe a principle of the capacitive input device. As shown in FIGS. 1A through 1C, if the user wants to operate a hemisphere key top 2 when his or her finger 3 approaches (or touches) the sensor (touch panel) 1 (see FIG. 1A), any capacitance occurs between the sensor 1 and the finger 3. This is because a human body has conductivity. The capacitance occurring between the sensor 1 and the finger 3 is given by the following equation (1).

$$C = (\epsilon * S)/D \quad (1)$$

where C indicates the capacitance; ε indicates a permittivity of each material; S indicates an area of the finger 3; and D indicates a distance between the sensor 1 and the finger 3. The capacitance C alters in inversely proportion to the distance D between the sensor (touch panel) 1 and the finger 3.

Such input device senses position information based on the capacitance occurring when the user's finger 3 touches the sensor 1 so that it can perform desired processing which the user indicates by his or her touching operation.

SUMMARY

In the capacitive touch panel (input device) in the digital camera disclosed in Japanese Patent Application Publication No. 2005-284416, however, the capacitance alters in inversely proportion to the distance between the input device and the user's finger, as described above. If the user puts on his or her glove 4 and operates the mobile phone and the like at a cold district or a ski resort as shown in FIG. 1C, the distance between the sensor 1 and the finger 3 increases by a thickness of an insulating material constituting the glove 4. This causes the capacitance sensed when the user puts on his or her glove to become smaller than the capacitance sensed when the input device is operated by a finger, not gloved one (see FIGS. 1B and 1C). As a result thereof, it is difficult to get the position information which the user indicates by his or her operation accurately, which may reduce a sensitivity of the input device.

It is conceivable to enhance the sensitivity of the input device previously. If, however, the user operates the input device with his or her finger 3 while enhancing the sensitivity of the input device previously, there may occur an issue of malfunction to sense any input information in spite of no touch of the user's finger to the input device because of the enhanced sensitivity thereof. As a result thereof, reliability of the slide-sensing operation of the input device may be deteriorated.

It is desirable to present an input device and an electronic apparatus using the same, which can adjust a sensitivity of an input-sensing unit of the input unit based on the user's operation environment.

According to an embodiment, there is provided an input device including an input-sensing unit that contains a capacitive input sensor and a sensitivity-sensing unit that contains a capacitive sensitivity sensor. The input-sensing unit senses position information obtained by touch operation of an operation body to the capacitive input sensor and outputs the position information. The sensitivity-sensing unit senses sensitivity information obtained by touch operation of the operation body to the capacitive sensitivity sensor and outputs the sensitivity information. The input device also includes a control unit that receives the position information from the input-sensing unit and receives the sensitivity information from the sensitivity-sensing unit and a sensitivity-adjusting unit that adjusts an output level of the position information from the input-sensing unit based on a result of the determination of the control unit. The control unit determines whether or not the output level of the position information from the input-sensing unit is adjusted based on the sensitivity information sensed by the sensitivity-sensing unit. The control unit also controls the sensitivity-adjusting unit to adjust the output level of the position information received from the input-sensing unit.

According to another embodiment, there is provided an electronic apparatus containing main body of the electronic apparatus, and an input device that is included in the main body and senses position information obtained by touch operation of an operation body. The input device includes an input-sensing unit that contains a capacitive input sensor and a sensitivity-sensing unit that contains a capacitive sensitivity sensor. The input-sensing unit senses the position information obtained by the touch operation of the operation body to the capacitive input sensor and outputs the position information. The sensitivity-sensing unit senses sensitivity information obtained by the touch operation of the operation body to the capacitive sensitivity sensor and outputs the sensitivity information. The input device also includes a control unit that receives the position information from the input-sensing unit and receives the sensitivity information from the sensitivity-sensing unit and a sensitivity-adjusting unit that adjusts an output level of the position information from the input-sensing unit based on a result of the determination of the control unit. The control unit determines whether or not the output level of the position information from the input-sensing unit is adjusted based on the sensitivity information sensed by the sensitivity-sensing unit. The control unit also controls the sensitivity-adjusting unit to adjust the output level of the position information received from the input-sensing unit.

In this embodiment, the control unit determines whether or not the output level of the position information from the input-sensing unit is adjusted based on the sensitivity information sensed by the sensitivity-sensing unit. The sensitivity-adjusting unit adjusts the output level of the position information from the input-sensing unit based on a result of the determination of the control unit. The sensitivity information includes the capacitance generated between the operation body and the sensitivity-sensing unit. Accordingly, if the control unit determines that the sensitivity information from the sensitivity-sensing unit is fallen short thereof, the control unit controls the sensitivity-adjusting unit to adjust an output level of the position information from the input-sensing unit based on a result of the determination of the control unit so that the output level of the position information becomes larger. This enables the sensitivity of the input-sensing unit to be enhanced. On the other hand, if the control unit determines that the sensitivity information from the sensitivity-sensing unit is exceeded, the control unit controls the sensitivity-adjusting unit to adjust an output level of the position information from the input-sensing unit based on a result of the determination of the control unit so that the output level of the position information becomes smaller. This enables the sensitivity of the input-sensing unit to be diminished.

According to a further embodiment, there is provided an input device including an input-sensing unit that contains a capacitive input sensor. The input-sensing unit senses position information obtained by touch operation of an operation body to the capacitive input sensor and outputs the position information. The input device also includes a temperature-measuring unit that measures environment temperature and outputs temperature information, a control unit that receives the position information from the input-sensing unit and receives the temperature information from the temperature-measuring unit, and a sensitivity-adjusting unit that adjusts an output level of the position information from the input-sensing unit. The control unit determines whether or not the output level of the position information from the input-sensing unit is adjusted. The control unit controls the sensitivity-adjusting unit to adjust the output level of the position information from the input-sensing unit based on a result of the determination of the control unit.

In an embodiment, it is possible to set the sensitivity of the input-sensing unit by sensing environment temperature of the electronic apparatus and previously predicting the operation environment (for example, an operation by gloved finger or an operation by a finger) of the operation body.

According to the above-mentioned embodiments of the application, it is capable of setting the sensitivity of the input-sensing unit to best one based on the operation environment of the user such as the operation by the gloved finger or the finger, thereby enabling accurate input of the information to be realized and preventing the malfunction.

The concluding portion of this specification particularly points out and directly claims the subject matter. However, those skilled in the art will best understand both the organization and method of operation of the application, together with further advantages and objects thereof, by reading the remaining portions of the specification in view of the accompanying drawing(s) wherein like reference characters refer to like elements.

Additional features and advantages are described herein, and will be apparent from, the following Detailed Description and the figures.

BRIEF DESCRIPTION OF THE FIGURES

FIGS. 2A and 2B are perspective views of an embodiment of a digital camera according to an embodiment for showing a configuration thereof;

DETAILED DESCRIPTION

The following will describe embodiments of the present application with reference to the drawings.

First Embodiment

[Configuration of Digital Camera]

Figure 1A:
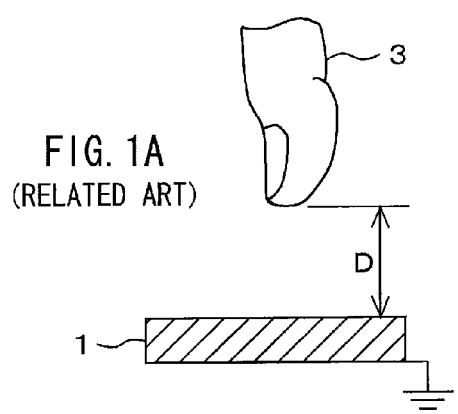
FIGS. 1A through 1C are diagrams each for illustrating a principle of capacitive input device.
Figure 1B:
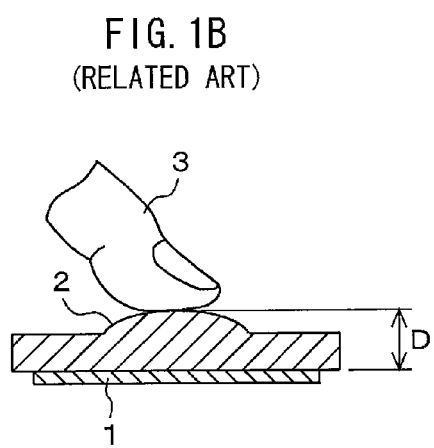
Figure 1C:
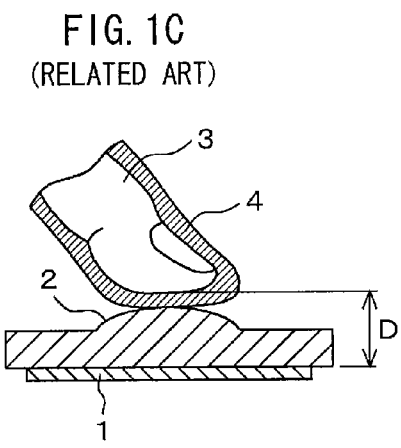
Figure 3:
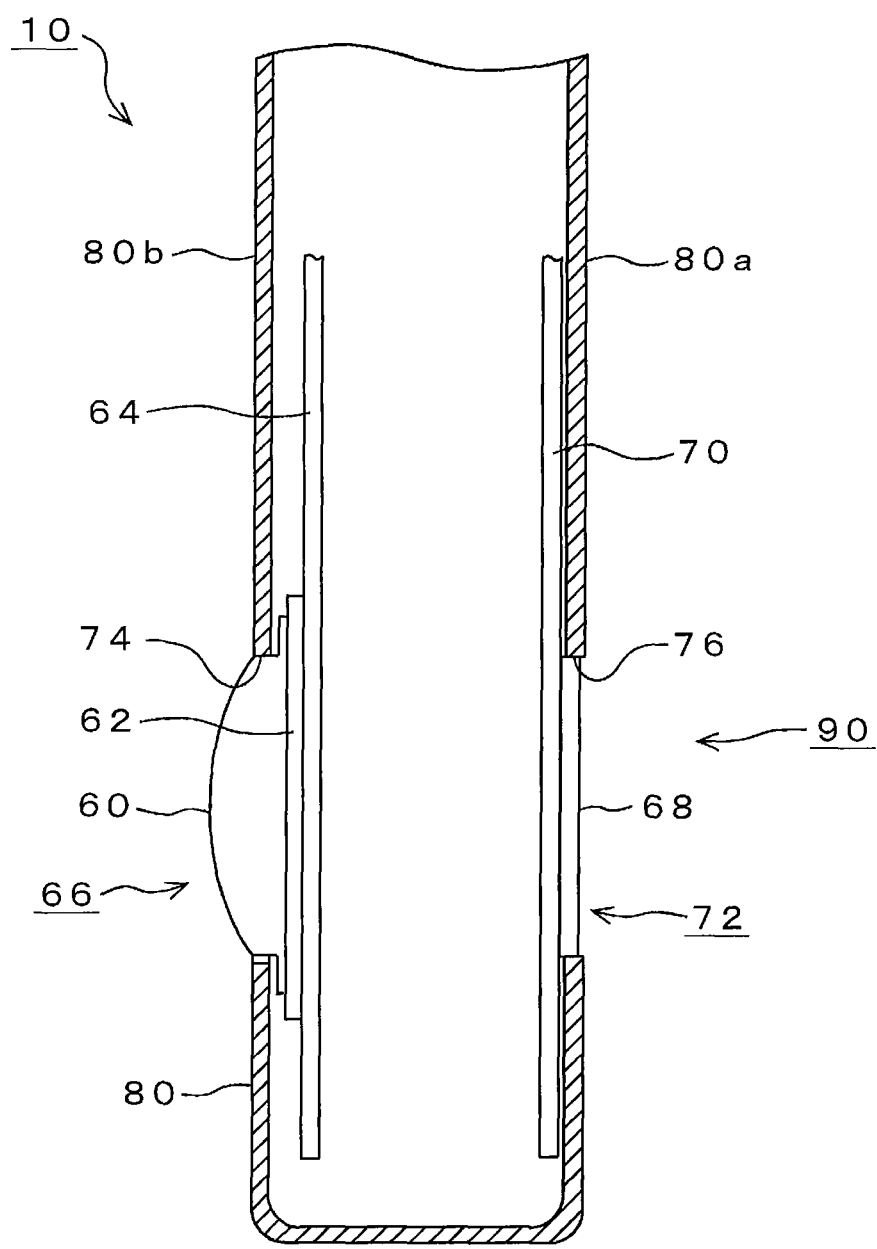
FIG. 3 is a sectional view of an embodiment of an input device of the digital camera for showing a configuration thereof.

FIG. 2A shows a configuration of a first embodiment of a digital camera 10 according to the present application, which is viewed from a front side thereof. FIG. 2B shows the configuration of the digital camera 10, which is viewed from a back side thereof. FIG. 3 shows a sectional side surface of the digital camera 10.

As shown in FIGS. 2A through 3, the digital camera 10 constitutes an electronic apparatus and contains a camera main body 80 and input device 90. The camera main body 80 is a rectangular container made of metallic material such as magnesium ally or aluminum. A shutter button 20 and a power button 26 are provided on an upper surface 80c of the camera main body 80. The camera main body 80 has a grip portion 22, which extends along a vertical direction thereof, at a left end of a front surface 80a thereof. The camera main body 80 also has a lens 18 at a right side of the front surface 80a thereof. The camera main body 80 further has a display unit 14 composed of a liquid crystal panel or the like at the back surface 80b thereof.

The input device 90 contains an input-sensing unit 66 that senses position information obtained by sliding and pushing operations of a user's thumb and a sensitivity-sensing unit 72 that senses sensitivity information obtained when the user's finger touches it. The input-sensing unit 66 and the sensitivity-sensing unit 72 are independently positioned at separate positions.

The input-sensing unit 66 contains a key top 60, an input sensor 62 and a circuit board 64. The key top 60 is an operation member having an almost hemispherical (doomed) operation surface on which the user performs the sliding and pushing operations. The key top 60 is attached and fixed to the camera main body 80 with the hemispherical operation surface thereof projecting through an opening 74 formed in the back surface 80b of the camera main body 80 so as to be exposed.

The input sensor 62 is a capacitive sensor which senses capacitance (sensitivity information) occurring when the user's thumb slides and pushes the operation surface of the key top 60. The input sensor 62 is composed of a flexible sheet member and is adhered to a back of the key top 60 through, for example, an adhesive member such as a double-sided adhesive tape. The circuit board 64 has a main surface (outside of the camera main body 80) on which the input sensor 62 is mounted. The circuit board 64 generates a position signal S1 (see FIG. 5) based on a variation of the capacitance sensed by the input sensor 62. The input sensor 62 may generate the position signal S1.

The sensitivity-sensing unit 72 contains a sensitivity sensor 68 and a circuit board 70. The sensitivity sensor 68 is a capacitive sensor which is similar to the input sensor 62. The sensitivity sensor 68 senses capacitance (sensitivity information) occurring when the user's finger slides and pushed an operation surface of the sensitivity sensor 68. The sensitivity sensor 68 is composed of a flexible sheet member. The sensitivity sensor 68 is positioned within an opening 76 formed in the front surface 80a of the camera main body 80 with a portion of the sensitivity sensor 68 being exposed.

The exposed portion of the sensitivity sensor 68 has a configuration that is somewhat larger than that of a tip of the gloved finger of the user 30. The sensitivity sensor 68 is preferably arranged at a position which the user's finger is easy to touch when the user grips the digital camera 10. In this embodiment, the sensitivity sensor 68 is arranged at a position of the front surface 80a, which is somewhat right side of the grip portion 22 thereof, when the user grips the camera main body 80 with his or her right hand. The sensitivity sensor 68 can be arranged at any position of the camera main body 80 other than the front surface 80a, for example, the back surface 80b, the upper surface 80c or a side surface 80d of the camera main body 80. The circuit board 70 has a main surface (outside of the camera main body 80) on which the sensitivity sensor 68 is mounted. The circuit board 70 generates a sensibility signal S2 (see FIG. 5) based on the capacitance sensed by the sensitivity sensor 68.

Figure 4A:
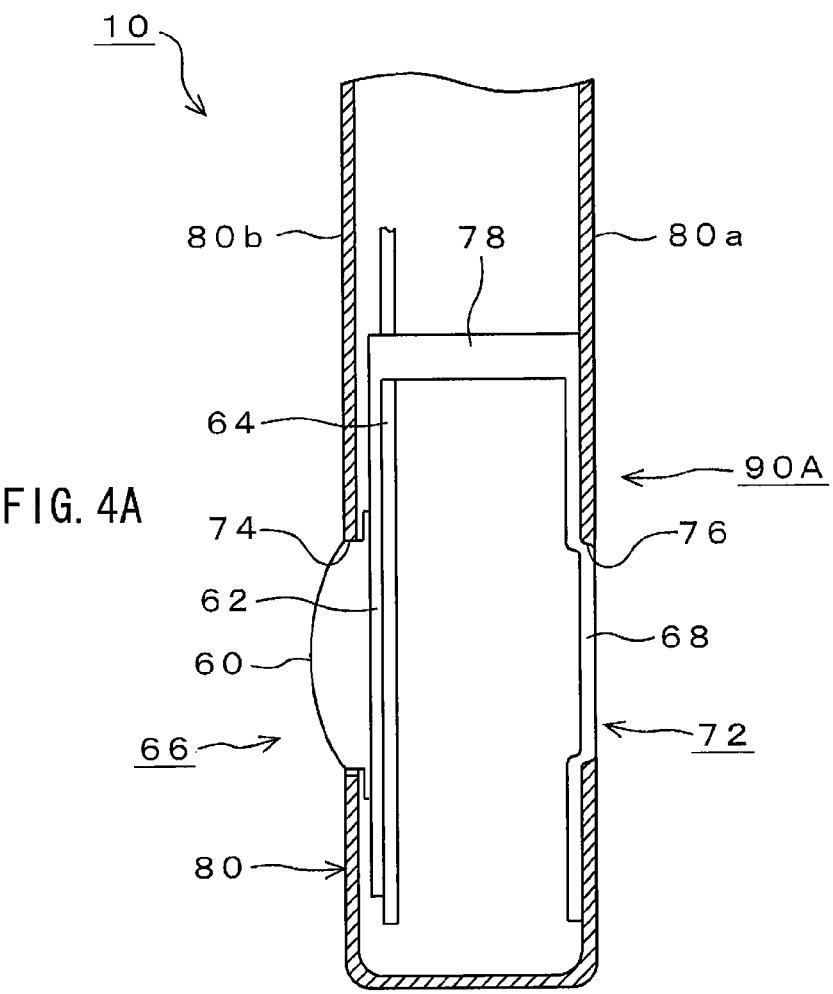
FIG. 4A is a sectional view of another embodiment of an input device of the digital camera for showing a configuration thereof and FIG. 4B is a perspective view of an essential part of the input device thereof for showing a configuration thereof.

It is to be noted that although the input sensor 62 and the sensitivity sensor 68 have been configured as separate members in the above-mentioned embodiment, they may be combined with each other so as to become one piece. FIG. 4A shows a configuration of another embodiment of such input device 90A of the digital camera 10 and FIG. 4B shows a configuration of an essential part of the input device 90A.

Figure 4B:
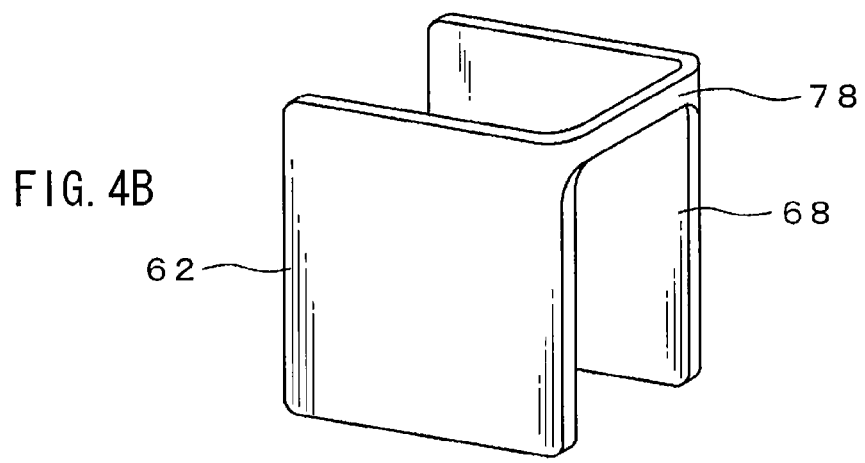

As shown in FIGS. 4A and 4B, the input sensor 62 and the sensitivity sensor 68 respectively have rectangular shapes and their upper portions are combined with each other by the connection sheet 78. In this embodiment, the input sensor 62 and the sensitivity sensor 68 are formed by one piece of the capacitive sheet member. The sensitivity sensor 68 is attached to the camera main body 80 so that a surface of a portion of the sensitivity sensor 68 is exposed to the outside through the opening 76 of the camera main body 80. The input sensor 62 is mounted on the circuit board 64. One piece of the circuit board 64 controls both the input sensor 62 and the sensitivity sensor 68. Thus, combining the input sensor 62 and the sensitivity sensor 68 with each other so as to become one piece allows the circuit board 64 to be shared, thereby realizing low costs therefor.

Figure 5:
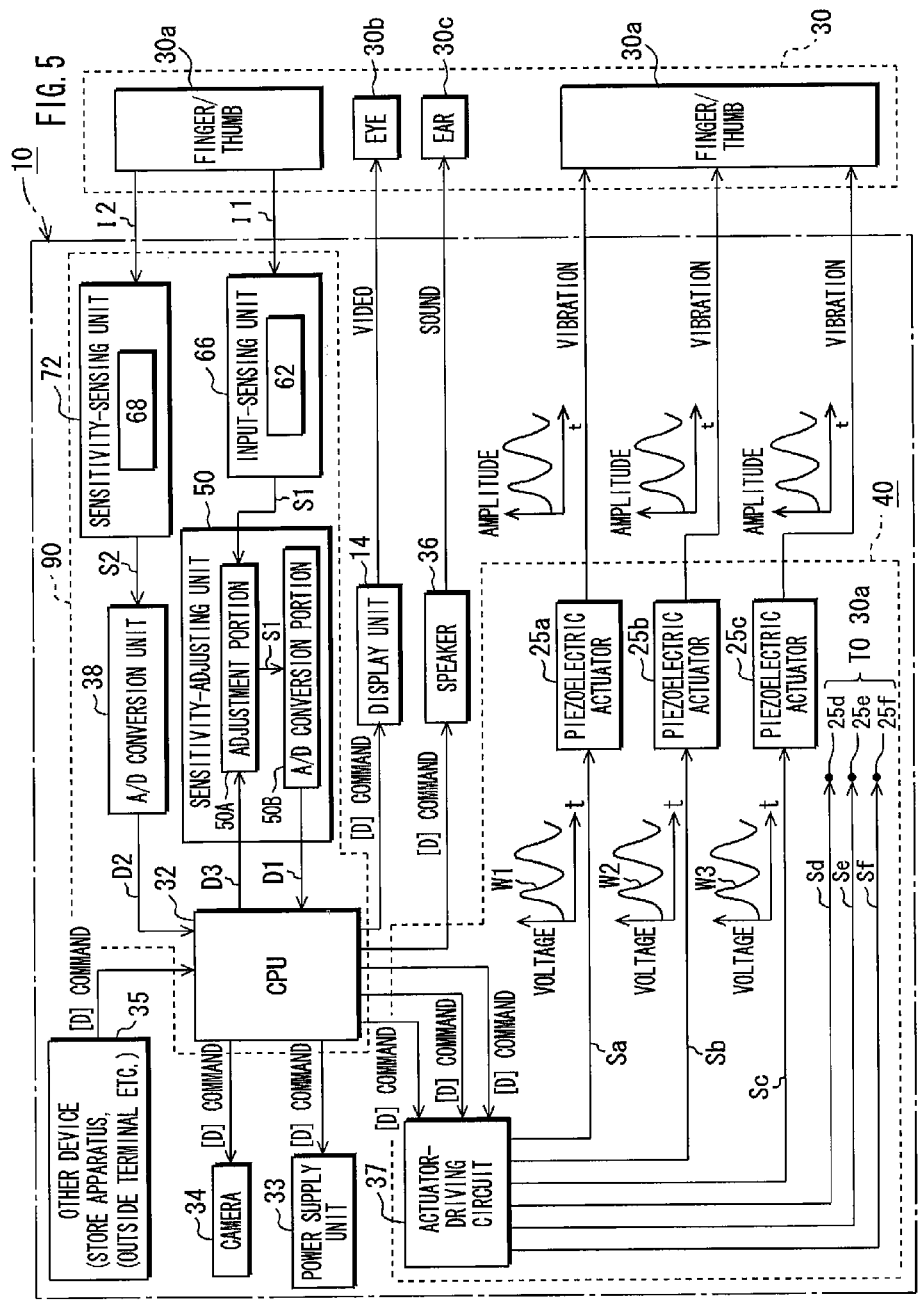
FIG. 5 is a block diagram showing a configuration of the embodiment of the digital camera according to an embodiment.

FIG. 5 shows an internal configuration of the digital camera 10. As shown in FIG. 5, the digital camera 10 contains an input-sensing unit 66, a sensitivity-sensing unit 72, an A/D conversion unit 38, a central processing unit (CPU) 32 constituting a control unit, a sensitivity-adjusting unit 50, a display unit 14, a power supply unit 33, a camera 34, other device 35, a speaker 36 and a vibration unit 40. To the CPU 32, the A/D conversion unit 38, the sensitivity-adjusting unit 50, the display unit 14, the power supply unit 33, the camera 34, other device 35, the speaker 36 and the vibration unit 40 are respectively connected.

The input-sensing unit 66 has the key top 60 with the operation surface as shown in FIG. 3 and senses position information (capacitance) I1 when a thumb 30a of the user 30 as an operation body touches the operation surface of the key top 60. The input-sensing unit 66 generates the position signal S1 based on the received position information I1 and supplies the generated position signal S1 to the sensitivity-adjusting unit 50.

The sensitivity-sensing unit 72 senses sensitivity information (capacitance) I2 when a finger 30a of the user 30 touches the sensitivity sensor 68. The sensitivity-sensing unit 72 generates the sensitivity signal S2 based on the sensed sensitivity information I2. The sensitivity-sensing unit 72 supplies the generated sensitivity signal S2 to the A/D conversion unit 38. The A/D conversion unit 38 performs A/D conversion on the sensitivity signal S2 received from the sensitivity-sensing unit 72 to generate sensitivity data D2 which is supplied to the CPU 32.

The CPU 32 receives the sensitivity data D2 from the A/D conversion unit 38 and determines whether or not the output level of the position signal S1 output from the input-sensing unit 66 is adjusted based on the received sensitivity data D2. The CPU 32 compares the sensitivity data D2 received from the A/D conversion unit 38 with a predetermined threshold value to generate adjustment data D3 for adjusting the sensitivity of the input-sensing unit 66 and supply the generated adjustment data D3 to the sensitivity-adjusting unit 50. For example, if the user operates the digital camera 10 with his or her gloved hand, the CPU 32 generates the adjustment data D3 that allows the sensitivity of the input-sensing unit 66 to be adjusted so as to be enhanced because the sensitivity of the input-sensing unit 66 is less sensed. On the other hand, if the user operates the digital camera 10 with his or her hand itself after he or she has operated the digital camera 10 with his or her gloved hand, the CPU 32 generates the adjustment data D3 that allows the sensitivity of the input-sensing unit 66 to be adjusted so as to be diminished (returned to a standard sensitivity).

The CPU 32 receives the position data D1 from the sensitivity-adjusting unit 50 and supplies the commands D to the power supply unit 33, the camera 34, other device 35, the display unit 14, the speaker 36 and an actuator-driving circuit 37, respectively. The CPU 32 has a function (algorithm) for processing a sine wave form, which is generated in the actuator-driving circuit 37, in the same vibration mode with setting a slide speed by the thumb 30a of the user 30 as parameter. The CPU 32 calculates a pattern of the vibration based on the slide speed sensed by the input-sensing unit 66. In this embodiment, the CPU 32 calculates the pattern of the vibration so that the doomed operation surface of the key top 60 of the input-sensing unit 66 generates and changes the vibration from the pattern of low frequency and small amplitude to the pattern of high frequency and large amplitude as the thumb 30a of the user 30 touching the doomed operation surface slides away from the touched position on the doomed operation surface.

The sensitivity-adjusting unit 50 adjusts an output level of the position signal S1, i.e., sensing of the position information I1, from the input-sensing unit 66 based on a result of the determination of the control unit and contains an adjustment portion 50A and an A/D conversion portion 50B. The adjustment portion 50A amplifies voltage (amplitude) of the position signal S1 received from the input-sensing unit 66 based on the adjustment data D3 received from the CPU 32. For example, the adjustment portion 50A amplifies the voltage of the position signal S1 received from the input-sensing unit 66 when the adjustment portion 50A receives the adjustment data D3 of a gloved case. On the other hand, the adjustment portion 50A diminishes the voltage of the position signal S1 received from the input-sensing unit 66 when the adjustment portion 50A receives the adjustment data D3 of a finger case, not gloved case. The A/D conversion portion 50B receives the position signal S1 from the adjustment portion 50A and performs the A/D conversion on the received position signal S1 to generate the position data D1 which is supplied to the CPU 32.

The display unit 14 displays a display screen based on the information input by the input-sensing unit 66. The display unit 14 has functions as a finder and the like in addition to a function of a monitor. For example, the display unit 14 displays various kinds of icons such as zoom-in icon, zoom-out icon, reproduction/forward mode icon, and volume adjustment mode (Vol) icon, based on the control information (command D) from the CPU 32.

The vibration unit 40 contains the actuator-driving circuit 37 and actuators 25a through 25f. The vibration unit 40 vibrates the operation surface of the key top 60 based on the pattern of vibration calculated by the CPU 32 so as to allow the vibration to be moved to a slide direction of the user's thumb 30a. The CPU 32 connects the actuator-driving circuit 37 which generates based on the commands D received from the CPU 32 vibration control signals Sa through Sf which are supplied to the actuators 25a through 25f. The vibration control signals Sa through Sf respectively have output wave forms W1 through W6. This enables the six actuators 25a through 25f to be driven.

The CPU 32 connects the camera 34 which shoots a subject through a lens 18 (see FIG. 2A) based on the command D. The camera 34 includes image-pickup device (charged-coupled device (CCD)), not shown, and outputs the image data obtained by shooting the subject.

Other device 35 includes a memory or an external terminal. For example, the memory stores the image data based on the command D from the CPU 32 or reads out the image data. The speaker 36 sounds icon confirmation, announce for handling of device or the like based on the command D from the CPU 32.

The power supply unit 33 connects a battery, not shown, which supplies the power to the input-sensing unit 66, the display unit 14, the CPU 32, the camera 34, other device (memory or external terminal) 35 and the vibration unit 40.

Such a configuration of the digital camera 10 allows to be generated plural species of the vibrations having patterns of vibrations (amplitude, frequency and vibration time) corresponding to the sliding speed or a period of sliding operation time by the thumb 30a of the user 30 for every user 30. The user 30 receives such a vibration with his or her thumb 30a to feel the vibration as the sense of touch for each function from the CPU 32. The user 30 also views contents displayed on the display unit 14 with his or her eyes 30b as the sense of sight to determine each function and hears sounds from the speaker 36 with his or her ears 30c as the sense of hearing to determine each function.

[Example of Usage of Digital Camera]

Figure 6:
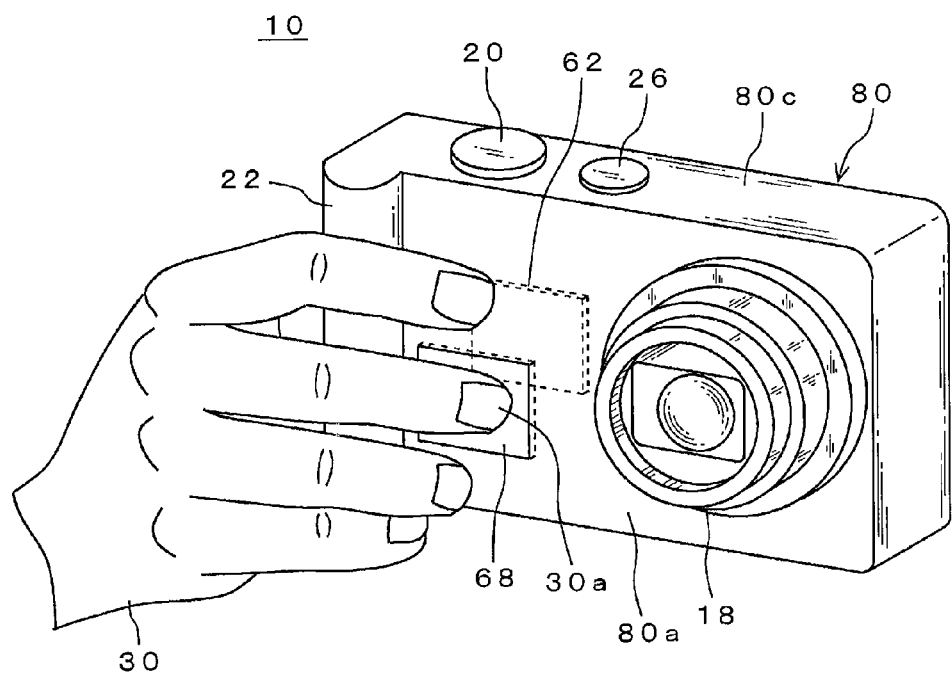
FIG. 6 is a diagram illustrating an example of usage of the digital camera.

The following will describe an example of usage of the above-mentioned digital camera 10. FIG. 6 illustrates the example of usage of the digital camera 10 as an embodiment of the application. The user 30 adjusts the sensitivity of the input-sensing unit 66 of the digital camera 10 when he or she operates the digital camera 10 with his or her gloved hand or he or she operates the digital camera 10 with his or her hand after he or she has operated the digital camera 10 with his or her gloved hand. As shown in FIG. 6, the user 30 pushes the sensitivity sensor 68 provided on the front surface 80a of the camera main body 80 of the digital camera 10 with the finger 30a of his or her right hand with his or her right hand gripping the digital camera 10. This enables the digital camera 10 to determine whether the user 30 operates the digital camera 10 with his or her gloved hand or the user 30 operates the digital camera 10 with his or her hand, not gloved hand, so that the sensitivity of the input-sensing unit 66 of the digital camera 10 can be adjusted to optimal one corresponding to the user's operation environment.

[Operation of Digital Camera]

Figure 7:
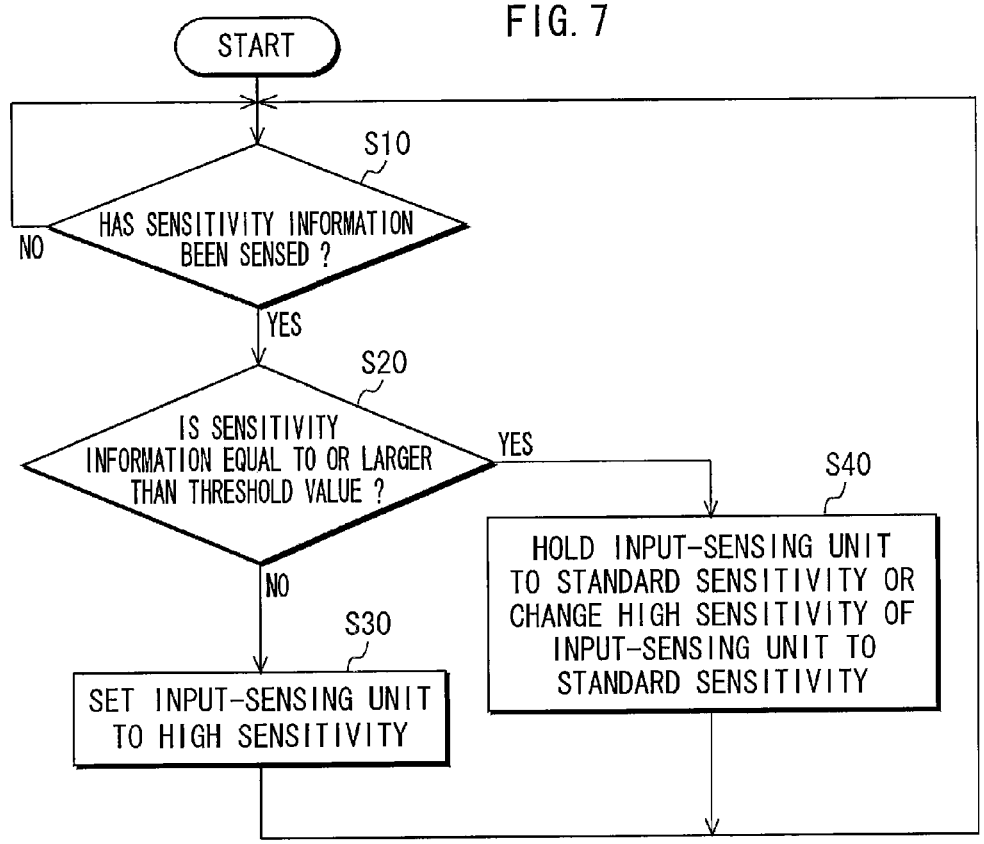
FIG. 7 is a flowchart showing an example of an operation of the digital camera.

The following will describe an example of an operation of the digital camera 10. FIG. 7 shows the example of an operation of the digital camera 10. In the following, a case where the user operates the input-sensing unit 66 with his or her gloved finger and a case where the user operates the input-sensing unit 66 with his or her finger will be described. In the following digital camera 10, the sensitivity of the input-sensing unit 66 when the user operates the input-sensing unit 66 with his or her finger is previously set to a standard sensitivity thereof.

At a step S10, the CPU 32 determines whether or not the finger 30a of the user 30 pushes on the sensitivity sensor 68. In other words, the CPU 32 determines whether or not it receives the sensitivity data D2 from the sensitivity-sensing unit 72 through the A/D conversion unit 38. If the CPU 32 determines that the finger 30a of the user 30 pushes on the sensitivity sensor 68, the process goes to a step S20. If the CPU 32 determines that the finger 30a of the user 30 does not push on the sensitivity sensor 68, the CPU 32 waits for input from the sensitivity-sensing unit 72.

At the step S20, the CPU 32 determines whether or not the value of the sensitivity data D2 received from the sensitivity-sensing unit 72 is equal to or larger than a predetermined threshold value. The data of threshold value is set based on the sensitivity data when the user operates the sensitivity-sensing unit 72 with his or her hand, not gloved one. In this embodiment, for example, the data of threshold value is set so that the threshold value is lower than the sensitivity data D2 when the user operates the digital camera 10 with his or her hand and the threshold value is higher than the sensitivity data D2 when the user operates the digital camera 10 with his or her gloved hand. Accordingly, the sensitivity data D2 when the user operates the digital camera 10 with his or her gloved hand is lower than the threshold value and the sensitivity data D2 when the user operates the digital camera 10 with his or her hand is higher than the threshold value. The CPU 32 reads the predetermined threshold value out of the memory (other device 35) and compares the sensitivity data D2 with the read-out threshold value. As a result of the comparison, if the CPU 32 determines that the sensitivity data D2 is less than the threshold value (or in a case where the user is gloved), the process goes to a step S30. If the CPU 32 determines that the sensitivity data D2 is not less than the threshold value (or in a case where the user is not gloved), the process goes to a step S40.

At the step S30, because the CPU 32 determines that the sensitivity data D2 is less than the threshold value (or that the user is gloved), the adjustment portion 50A of the sensitivity-adjusting unit 50 amplifies voltage or the like of the position signal S1 up to a predetermined amplification factor based on the adjustment data D3 received from the CPU 32 so that the input-sensing unit 66 can be set to its high sensitivity based on the adjustment data D3 received from the CPU 32. After the setting of the sensitivity thereof has finished, the process goes back to the step S10 where the CPU 32 waits for the input from the sensitivity-sensing unit 72.

At the step S40, because the CPU 32 determines that the sensitivity data D2 is not less than the threshold value (or that the user is not gloved), the adjustment portion 50A of the sensitivity-adjusting unit 50 keeps or diminishes the voltage or the like of the position signal S1 down to a predetermined amplification factor based on the adjustment data D3 received from the CPU 32 so that the sensitivity of the input-sensing unit 66 can be maintained or changed to its standard sensitivity from its high sensitivity based on the adjustment data D3 received from the CPU 32. For example, when the input-sensing unit 66 has been set to the standard sensitivity at a previous stage, the sensitivity of the input-sensing unit 66 is maintained at its standard sensitivity. When the input-sensing unit 66 has been set to the high sensitivity at a previous stage, the sensitivity of the input-sensing unit 66 is returned to its standard sensitivity by diminishing the voltage of the position signal S1 output from the input-sensing unit 66. In other words, when the user operates the digital camera 10 with his or her finger by taking off the glove after the user has operated the digital camera 10 with his or her gloved hand, the sensitivity of the input-sensing unit 66 is changed from its high sensitivity to its standard sensitivity. After the setting of the sensitivity thereof has finished, the process goes back to the step S10 where the CPU 32 waits for the input from the sensitivity-sensing unit 72.

As described above, according to an embodiment, it is possible to adjust the sensitivity of the input-sensing unit 66 to its optimal sensitivity based on the operation environment of the user such as a case where the user is gloved or not. This enables accurate information to be input, thereby preventing the malfunction.

Second Embodiment

The following will describe a second embodiment with reference to the drawings. It is to be noted that like components shown in the drawings which are similar to those of the digital camera 10 described in the above-mentioned first embodiment denote like symbols, the detailed description of which will be omitted.

[Configuration of Digital Camera]

Figure 8:
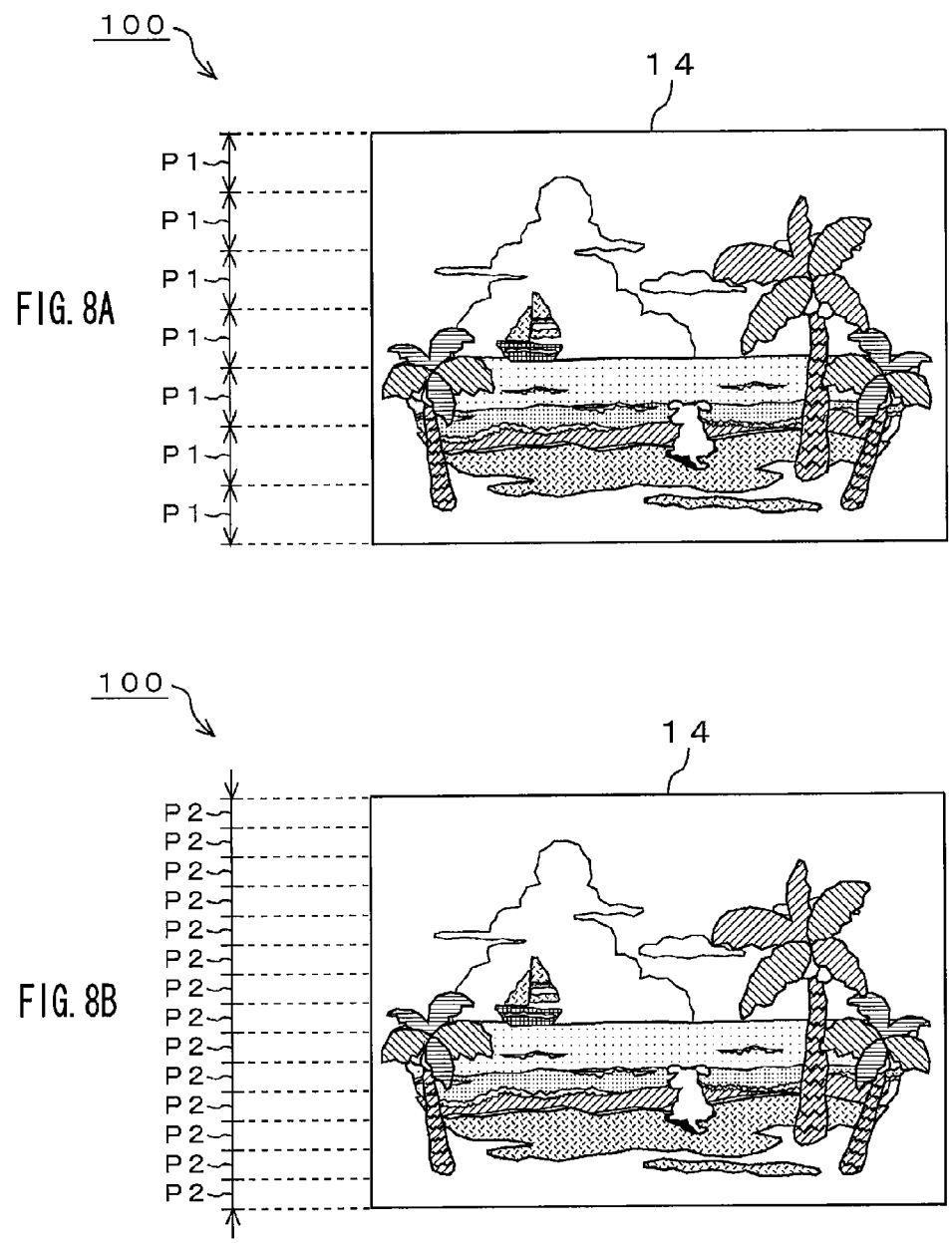
FIGS. 8A and 8B are diagrams each showing an example of a slide pitch in a screen of another embodiment of a digital camera.

FIGS. 8A and 8B respectively show an example of a slide pitch in a display screen of the display unit 14 in a second embodiment of a digital camera 100 according to the application. In this embodiment, the control is carried out so that the slide pitch on the display screen when the user operates the digital camera 100 with his or her hand is different from the slide pitch on the display screen when the user operates the digital camera 100 with his or her gloved hand.

For example, when the user 30 operates the input-sensing unit 66 of the digital camera 100 with his or her gloved thumb 30a, his or her operation is slower than that of a case where the user 30 operates the input-sensing unit 66 of the digital camera 100 with his or her thumb 30a. Accordingly, the CPU 32 (see FIG. 5) changes its operation control so that the slide pitch on the display screen at a period of the operation time becomes wider, thereby enabling the operation on the display screen such as scroll operation to be realized by any smaller operation movement of the thumb 30a of the user 30. In this embodiment, as shown in FIG. 8A, the display screen of the display unit 14 is divided by 7 pieces at a slide pitch P1 in a vertical direction thereof. The display screen of the display unit 14 can be divided according to the same way also in a horizontal direction thereof.

On the other hand, when the user 30 operates the input-sensing unit 66 of the digital camera 100 with his or her thumb, not gloved thumb, his or her operation can be performed finer than that of a case where the user operates the input-sensing unit 66 of the digital camera 100 with his or her gloved thumb 30a. Accordingly, the CPU 32 changes its operation control so that the slide pitch on the display screen of the display unit 14 at a period of the operation time becomes narrower than that of a case where the user operates the input-sensing unit 66 of the digital camera 100 with his or her gloved thumb 30a. In this embodiment, as shown in FIG. 8B, the display screen of the display unit 14 is divided by 14 pieces at a display pitch P2 in a vertical direction thereof. The display screen of the display unit 14 can be divided according to the same way also in a horizontal direction thereof.

Such a configuration allows the display screen to be scrolled by the display pitch P1 in a case where the user operates the input-sensing unit 66 of the digital camera 100 with his or her gloved thumb 30a or by the display pitch P2 in a case where the user operates the input-sensing unit 66 of the digital camera 100 with his or her thumb 30a if the user slides along the operation surface of the key top 60 (see FIG. 3) by the same distance with his or her gloved thumb 30a or thumb 30a.

[Operation of Digital Camera]

Figure 9:
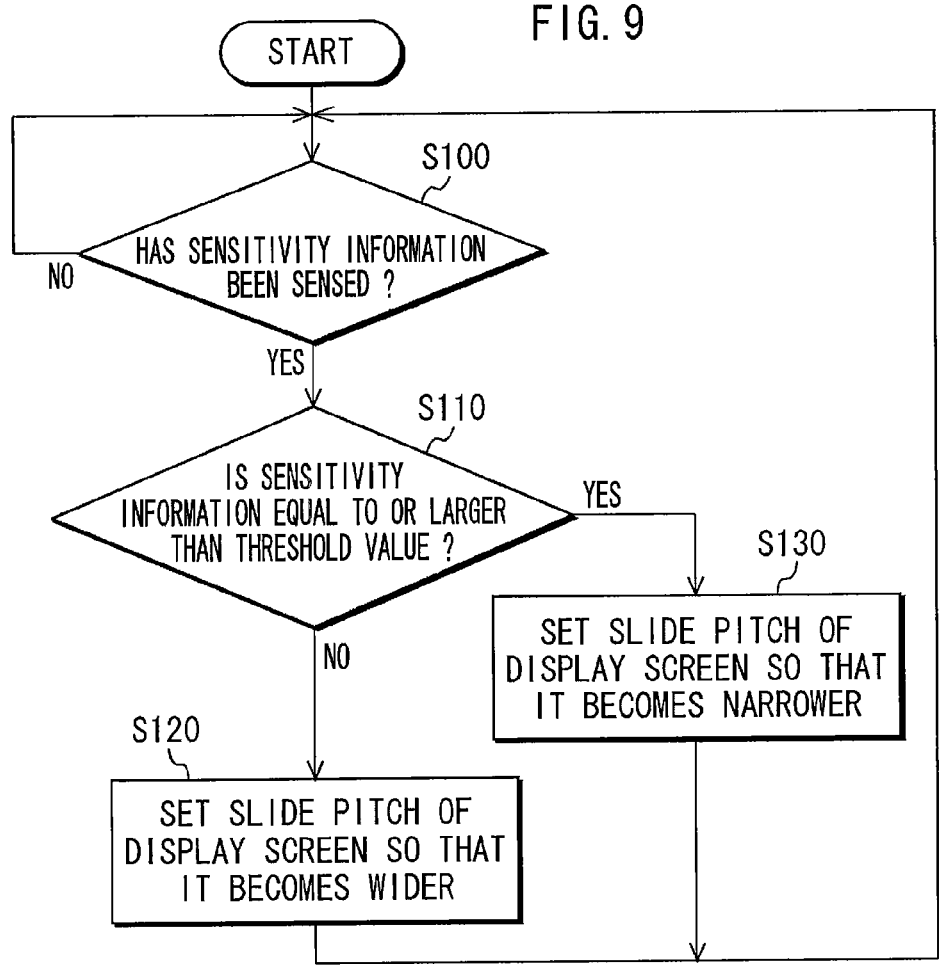
FIG. 9 is a flowchart showing an example of an operation of the above-mentioned another embodiment of the digital camera.

The following will describe an operation of the digital camera 100 with reference to FIGS. 5 and 9. FIG. 9 shows an example of the operation of the digital camera 100. It is to be noted that the processing of steps S100 and S110 are identical to those of the steps S10 and S20 of the digital camera 10 described according to the first embodiment, detailed description of which will be omitted.

At a step S120, if the CPU 32 determines that the sensitivity data D2 received from the A/D conversion unit 38 is less than the threshold value (or that the user is gloved), the CPU 32 generates the command D for changing the slide pitch on the display screen of the display unit 14 based on the sensitivity data D2 and supplies the generated command D to the display unit 14. The display unit 14 changes the slide pitch on the display screen thereof to the pitch P1 of a case where the user is gloved (see FIG. 8A). After the slide pitch has changed, the process goes back to the step S100 where the CPU 32 waits for the input from the sensitivity-sensing unit 72.

At the step S130, if the CPU 32 determines that the sensitivity data D2 received from the A/D conversion unit 38 is not less than the threshold value (or that the user is not gloved), the CPU 32 generates the command D for changing the slide pitch on the display screen of the display unit 14 based on the sensitivity data D2 and supplies the generated command D to the display unit 14. The display unit 14 changes the slide pitch on the display screen thereof to the pitch P2 of a case where the user is not gloved (see FIG. 8B). After the slide pitch has changed, the process goes back to the step S100 where the CPU 32 waits for the input from the sensitivity-sensing unit 72.

As described above, according to this embodiment, it is possible to slide an image or operation screen displayed on the display screen by smaller operation movement even when the user is gloved so that his or her operation is slow because the slide pitch is set so as to be wider than that of a case where the user is not gloved. This enables suitable operation to be realized if the user is gloved.

Third Embodiment

The following will describe a third embodiment with reference to the drawings. It is to be noted that like components shown in the drawings which are similar to those of the digital camera 10 described in the above-mentioned first embodiment denote like symbols, the detailed description of which will be omitted.

The user may operate a digital camera 200 with him or her being gloved because a cold district or a ski resort is cold, as described in the above-mentioned first embodiment. The capacitive input-sensing unit 66 may deteriorate its sensitivity because of the thickness of the glove of the user. According to this third embodiment, the digital camera 200 contains a temperature-measuring unit 106 that measures environment temperature. The digital camera 200 enhances the sensitivity of the input-sensing unit 66 on an assumption that the user operates a digital camera 200 with him or her being gloved if the outside is cold.

[Configuration of Digital Camera]

Figure 10:
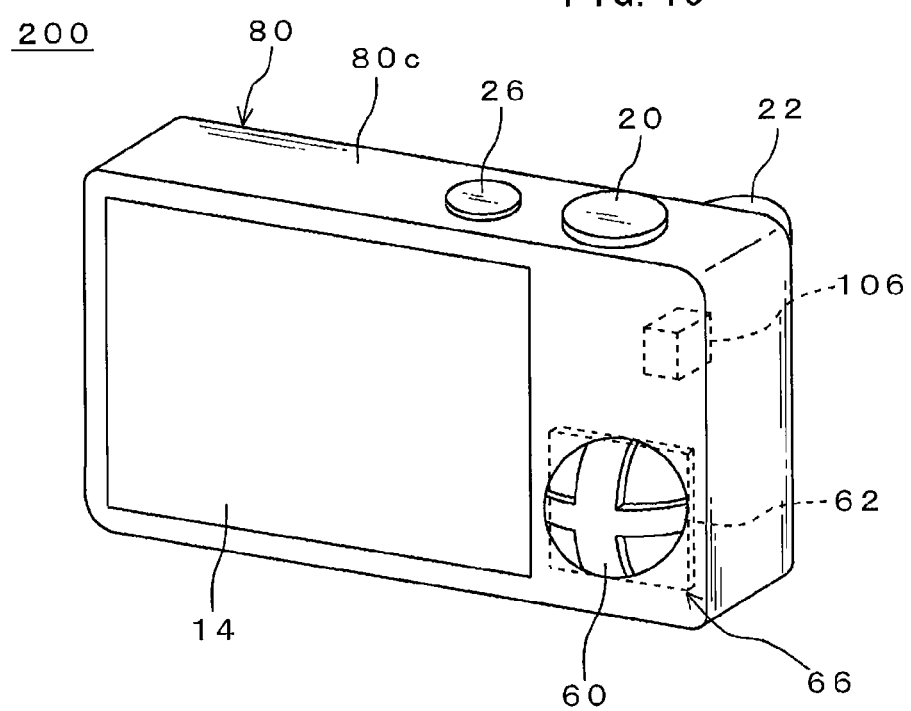
FIG. 10 is a diagram showing a configuration of further embodiment of a digital camera.

FIG. 10 shows a configuration of the digital camera 200. As shown in FIG. 10, the digital camera 200 contains the temperature-measuring unit 106 that measures the environment temperature thereof. The temperature-measuring unit 106 is constituted of, for example, platinum resistance, thermistor, thermo couple or the like and is installed inside the digital camera 200.

Figure 11:
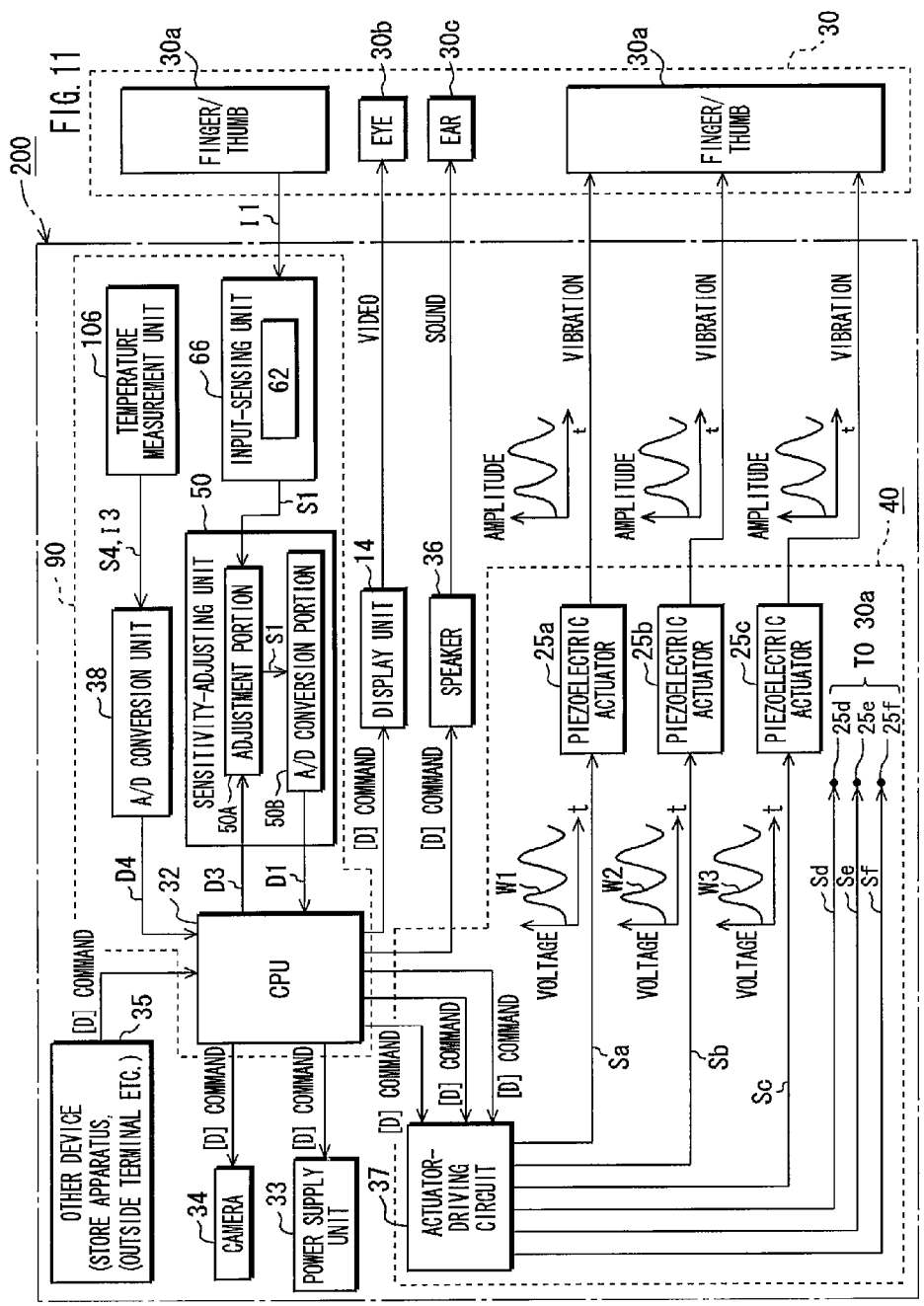
FIG. 11 is a block diagram showing an internal configuration of the above-mentioned further embodiment of the digital camera.

FIG. 11 shows an internal configuration of the digital camera 200. As shown in FIG. 11, the temperature-measuring unit 106 measures an environment temperature of the digital camera 200 when power of the digital camera 200 is on and generates a temperature signal S4 based on information I3 on the temperature thus measured. The temperature-measuring unit 106 supplies the generated temperature signal S4 to the A/D conversion unit 38 which converts it to digital temperature data D4. The A/D conversion unit 38 supplies the digital temperature data D4 to the CPU 32.

The CPU 32 receives the digital temperature data D4 from the A/D conversion unit 38 and generates adjustment data D3 for adjusting the sensitivity of the input-sensing unit 66 based on the received digital temperature data D4 to supply it the sensitivity-adjusting unit 50. The sensitivity-adjusting unit 50 adjusts the sensitivity of the input-sensing unit 66 by, for example, amplifying voltage of the position signal S1 received from the input-sensing unit 66 based on the adjustment data D3 received from the CPU 32.

[Operation of Digital Camera]

Figure 12:
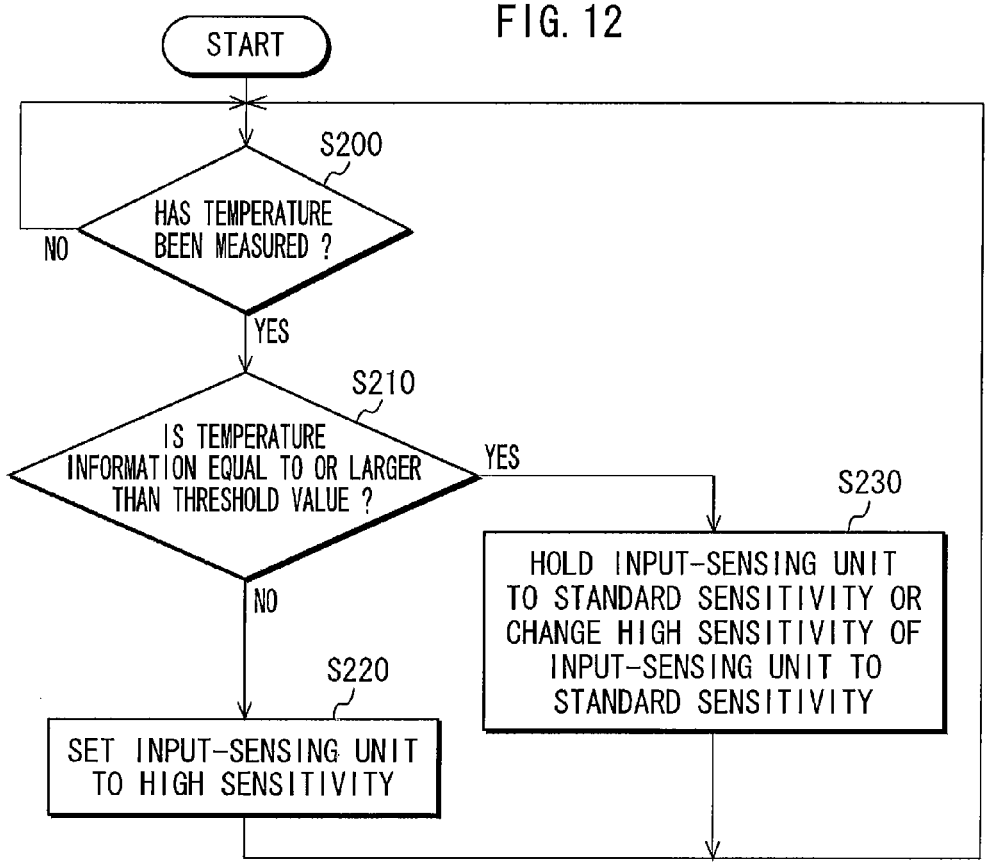
FIG. 12 is a flowchart showing an example of an operation of the above-mentioned further embodiment of the digital camera.

The following will describe an example of the operation of the digital camera 200. FIG. 12 shows the example of the operation of the digital camera 200.

At a step S200, the CPU 32 determines whether or not the temperature-measuring unit 106 measures the temperature of the outer environment of the digital camera 200. In other words, the CPU 32 determines whether or not it receives the temperature data D4 from the temperature-measuring unit 106 through the A/D conversion unit 38. If the CPU 32 determines that the temperature-measuring unit 106 measures the temperature of the outer environment of the digital camera 200, the process goes to a step S210. If the CPU 32 determines that the temperature-measuring unit 106 does not measure the temperature of the outer environment of the digital camera 200, the CPU 32 waits for input from the temperature-measuring unit 106.

At the step S210, the CPU 32 determines whether or not the value of the temperature data D4 received from the temperature-measuring unit 106 through the A/D conversion unit 38 is equal to or larger than a predetermined threshold value. The threshold value is set to a temperature on which a general user is estimated as to be gloved. The CPU 32 reads the data of predetermined threshold value out of the memory (other device 35) and compares the temperature data D4 with the read threshold value. As a result of the comparison, if the CPU 32 determines that the temperature data D4 is less than the threshold value (or in a case where the environment temperature is less than the threshold value), the process goes to a step S220. If the CPU 32 determines that the temperature data D4 is not less than the threshold value (or in a case where the environment temperature is not less than the threshold value), the process goes to a step S230.

At the step S220, if the CPU 32 determines that the temperature data D4 is less than the threshold value, the adjustment portion 50A of the sensitivity-adjusting unit 50 amplifies voltage or the like of the position signal S1 up to a predetermined amplification factor based on the adjustment data D3 received from the CPU 32 so that the input-sensing unit 66 can be set to its high sensitivity based on the adjustment data D3 received from the CPU 32. Namely, in a case where a value of the environment temperature is less than the threshold value, the input-sensing unit 66 is set to its high sensitivity. After the setting of the sensitivity thereof has finished, the process goes back to the step S200 where the CPU 32 waits for the input from the sensitivity-sensing unit 72.

At the step S230, if the CPU 32 determines that the temperature data D4 is not less than the threshold value, the adjustment portion 50A of the sensitivity-adjusting unit 50 keeps the standard sensitivity of the input-sensing unit 66 or diminishes the sensitivity of the input-sensing unit 66 from its high sensitivity to its low (standard) sensitivity based on the adjustment data D3 received from the CPU 32. For example, when the sensitivity of the input-sensing unit 66 has been set to the standard sensitivity at a previous stage and the value of the environment temperature is not less than the threshold value, the sensitivity of the input-sensing unit 66 is maintained at its standard sensitivity. When the sensitivity of the input-sensing unit 66 has been set to the high sensitivity at a previous stage and the value of the environment temperature is not less than the threshold value, the sensitivity of the input-sensing unit 66 is returned to its standard sensitivity by diminishing the voltage or the like of the position signal S1 output from the input-sensing unit 66. After the setting of the sensitivity thereof has finished, the process goes back to the step S200 where the CPU 32 waits for the input from the sensitivity-sensing unit 72.

As described above, according to this embodiment, by measuring the environment temperature of the digital camera 200 to predict whether the user 30 operates the digital camera 200 with his or her gloved hand or hand, the sensitivity of the input-sensing unit 66 is previously set so that it is possible to adjust the sensitivity of the input-sensing unit 66 to its optimal sensitivity based on the operation environment of the user such as a case where the user is gloved or not.

It is to be noted that although the digital camera 10, 100 or 200 has been provided with the sensitivity-adjusting unit 50, the sensitivity-sensing unit 72 and the like in the above-mentioned embodiments, this application is not limited thereto. This application is applicable to an electronic apparatus which is provided with a capacitive sensor or touch panel.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. An input device comprising:
    an input-sensing unit that contains a capacitive input sensor, the input-sensing unit sensing position information obtained by touch operation of an operation body to the capacitive input sensor and outputting the position information;
    a sensitivity-sensing unit that contains a capacitive sensitivity sensor, the sensitivity-sensing unit sensing sensitivity information obtained by the touch operation of the operation body to the capacitive sensitivity sensor and outputting the sensitivity information, wherein the position information is independent from the sensitivity information;
    a control unit that receives the position information from the input-sensing unit and receives the sensitivity information from the sensitivity-sensing unit, the control unit determining whether or not an amplitude of the output of the position information from the input-sensing unit is adjusted based on the sensitivity information sensed by the sensitivity-sensing unit, and when the control unit determines that the amplitude of the output of the position information is to be adjusted based on the sensitivity information sensed by the sensitivity-sensing unit, the control unit generates adjustment data and transmits the adjustment data to a sensitivity adjusting unit; and
    the sensitivity-adjusting unit that adjusts the amplitude of the output of the position information from the input-sensing unit based on the adjustment data received from the control unit,
    wherein the control unit controls the sensitivity-adjusting unit to adjust the amplitude of the output of the position information received from the input-sensing unit, and
    wherein the control unit generates adjustment information for increasing the amplitude of the output of the position information from the input-sensing unit if the sensitivity information sensed by the sensitivity-sensing unit is compared with a predetermined threshold value when the control unit determines that the sensitivity information is smaller than the predetermined threshold value.

2. The input device according to claim 1 wherein the sensitivity-adjusting unit contains an amplification portion that amplifies the position information received from the input-sensing unit; and
    wherein the amplification portion adjusts the amplitude of the output of the position information based on the adjustment information.

3. The input device according to claim 1 wherein the input-sensing unit contains the capacitive input sensor having a sheet shape and the sensitivity-sensing unit contains the capacitive sensitivity sensor having a sheet shape; and
    wherein the input-sensing unit is combined with the sensitivity-sensing unit so as to become one piece.

4. The input device according to claim 1 wherein the input-sensing unit is separate from the sensitivity-sensing unit such that the sensitivity-sensing unit senses the sensitivity information obtained by a touch of a second operation body to the capacitive sensitivity sensor.

5. The input device according to claim 1 wherein the input-sensing unit is separate from the sensitivity-sensing unit such that the capacitive sensitivity sensor is located on an opposite side of the input device from the capacitive input sensor.

6. An input device comprising:
    an input-sensing unit that contains a capacitive input sensor, the input-sensing unit sensing position information obtained by touch operation of an operation body to the capacitive input sensor and outputting the position information;
    a sensitivity-sensing unit that includes a temperature-measuring unit that measures environment temperature and outputs temperature information as sensitivity information, wherein the position information is independent from the sensitivity information;
    a control unit that receives the position information from the input-sensing unit and receives the sensitivity information from the sensitivity-sensing unit, the control unit determining whether or not an amplitude of the output of the position information from the input-sensing unit is adjusted based on the sensitivity information from the sensitivity-sensing unit, and when the control unit determines that the amplitude of the output of the position information is to be adjusted based on the sensitivity information from the sensitivity-sensing unit, the control unit generates adjustment data and transmits the adjustment data to a sensitivity adjusting unit; and
    the sensitivity-adjusting unit that adjusts the amplitude of the output of the position information from the input-sensing unit based on the adjustment data received from the control unit,
    wherein the control unit controls the sensitivity-adjusting unit to adjust the amplitude of the output of the position information from the input-sensing unit, and
    wherein the control unit generates adjustment information for increasing the amplitude of the output of the position information from the input-sensing unit if the sensitivity information sensed by the sensitivity-sensing unit is compared with a predetermined threshold value when the control unit determines that the sensitivity information is smaller than the predetermined threshold value.

7. An electronic apparatus comprising:
    a main body of the electronic apparatus; and
    an input device that is included in the main body, the input device sensing position information obtained by touch operation of an operation body,
    the input device including:
    an input-sensing unit that contains a capacitive input sensor, the input-sensing unit sensing the position information obtained by the touch operation of the operation body to a first capacitive touch sensor and outputting the position information;
    a sensitivity-sensing unit that contains a capacitive sensitivity sensor, the sensitivity-sensing unit sensing sensitivity information obtained by the touch operation of the operation body to the capacitive sensitivity sensor and outputting the sensitivity information, wherein the position information is independent from the sensitivity information;
    a control unit that receives the position information from the input-sensing unit and receives the sensitivity information from the sensitivity-sensing unit, the control unit determining whether or not an amplitude of the output of the position information from the input-sensing unit is adjusted based on the sensitivity information sensed by the sensitivity-sensing unit, and when the control unit determines that the amplitude of the output of the position information is to be adjusted based on the sensitivity information sensed by the sensitivity-sensing unit, the control unit generates adjustment data and transmits the adjustment data to a sensitivity adjusting unit; and the sensitivity-adjusting unit that adjusts the amplitude of the output of the position information from the input-sensing unit based on the adjustment data received from the control unit, wherein the control unit controls the sensitivity-adjusting unit to adjust the amplitude of the output of the position information received from the input-sensing unit, and wherein the control unit generates adjustment information for increasing the amplitude of the output of the position information from the input-sensing unit if the sensitivity information sensed by the sensitivity-sensing unit is compared with a predetermined threshold value when the control unit determines that the sensitivity information is smaller than the predetermined threshold value.

* * * * *